(12) United States Patent
Touchais-Papet et al.

(10) Patent No.: US 6,259,066 B1
(45) Date of Patent: Jul. 10, 2001

(54) PROCESS AND DEVICE FOR PROCESSING A MATERIAL BY ELECTROMAGNETIC RADIATION IN A CONTROLLED ATMOSPHERE

(75) Inventors: Emmanuelle Touchais-Papet; Rene-Pierre Ducret, both of Meylan (FR)

(73) Assignee: Joint Industrial Processors for Electronics, Noyen sur Sarthe (FR)

( * ) Notice: Subject to any disclaimer, the term of this patent is extended or adjusted under 35 U.S.C. 154(b) by 0 days.

(21) Appl. No.: 09/556,956

(22) Filed: Apr. 21, 2000

(30) Foreign Application Priority Data

Apr. 26, 1999 (FR) .................................................. 99 05413

(51) Int. Cl.⁷ ....................................................... A21B 1/00
(52) U.S. Cl. ............................ 219/411; 219/390; 118/724
(58) Field of Search ..................................... 219/390, 405, 219/411; 118/724, 725, 50.1; 392/416, 418

(56) References Cited

U.S. PATENT DOCUMENTS

| | | | |
|---|---|---|---|
| 4,558,660 | * 12/1985 | Nishizawa et al. | ................ 118/725 |
| 4,837,484 | 6/1989 | Eliasson et al. . | |
| 5,441,569 | 8/1995 | Veligdan et al. . | |
| 5,863,327 | 1/1999 | Thakur . | |

OTHER PUBLICATIONS

R. Singh et al., "Rapid Photothermal Processing", *Solid State Technology*, vol. 40, No. 10, Oct. 1997, pp. 193–194, 198.
I. Boyd et al., "New Large Area Ultraviolet Lamp Sources and Their Applications", *Nuclear Instruments & Methods in Physics Research B*, 121 (1997), pp. 349–356.

* cited by examiner

*Primary Examiner*—Teresa Walberg
*Assistant Examiner*—Shawntina Fuqua
(74) *Attorney, Agent, or Firm*—Oliff & Berridge, PLC

(57) ABSTRACT

A process for processing or forming a material by electromagnetic radiation and in a controlled atmosphere or in a vacuum inside a reaction chamber uses a first infrared radiation causing rapid heating and a second ultraviolet radiation of the excimer type having a spectral resolution lower than 40 nm, regardless of the wavelength of the ultraviolet radiation, so as to generate a suitable photon flux either for modification of the physico-chemical properties of the material or for formation of a deposit on the substrate. The exposure time of the second ultraviolet radiation is lower than that of the first infrared radiation and the processing temperature is comprised between 70° C. and 800° C. depending on the nature of the material and of the substrate.

8 Claims, 2 Drawing Sheets

PROCESS AND DEVICE FOR PROCESSING A MATERIAL BY ELECTROMAGNETIC RADIATION IN A CONTROLLED ATMOSPHERE

BACKGROUND OF THE INVENTION

The invention relates to a process for processing a material by electromagnetic radiation and in a controlled atmosphere or in a vacuum inside a reaction chamber, the assembly being subjected to a first infrared radiation causing rapid heating to a preset temperature so as to modify the physico-chemical properties of the material arranged on a substrate or to perform deposition of the material on said substrate.

STATE OF THE TECHNIQUE

The material is generally deposited on a support formed by a substrate with the possible addition of intermediate sub-layers. The substrate is generally constituted by silicon in the microelectronics field, but it may also be made of another material, notably polymer, glass or ceramic. The sub-layers can be of widely varying kinds and be deposited previously on the substrate by a suitable technique. An example of a sub-layer can be constituted by a printed circuit or an insulating coating.

To modify the physico-chemical properties of a material, the latter has to be subjected to annealing at high temperature, generally greater than 1000° C. with known heating techniques. Nevertheless if the substrate or the sub-layers are fragile, it is not possible to use a high temperature since the substrate or the sub-layers are liable to be destroyed.

In the microelectronics field, rapid thermal processing applications such as RTP annealing and RTCVD chemical vapour deposition are implemented in special furnaces in a vacuum or in a controlled atmosphere. In the case of RTP, rapid heating of the material to a preset temperature is obtained in order to subsequently modify the physico-chemical properties of the material either during maintaining of the temperature or during decrease of the temperature. In the case of RTCVD, rapid heating of a surface in contact with reactive gaseous species enables a thin layer of a material to be deposited on this surface by reaction between the gaseous species and the heated surface.

Rapid thermal processings have to be stable and reproducible and are generally performed in furnaces with infrared radiation lamps IR and cold walls.

When thermal processings are performed, the maximum temperature reached during rapid heating is very high and can be comprised between 1000° C. and 2000° C. depending on the type of applications. The range of materials able to be treated is thus limited, as more and more substrates are not designed to withstand high temperatures, notably those achieved with a polymer base, materials with low melting points, CMOS component supports, etc.

The action of ultraviolet radiation UV to modify certain chemical components due to the effect of photonic UV radiation is moreover known. Among the photon UV sources, conventional xenon, mercury and deuterium UV lamps having a wide spectral band comprised between 100 and 800 nm and a relatively low power can be distinguished. Lasers of the $CO_2$, Nd, YAG, Ar, and excimer type also exist, constituting costly emitters having a narrow central band and a reduced spatial resolution of about a few $cm^2$.

The document U.S. Pat. No. 4,837,484 describes a UV discharge lamp having a narrow spectral resolution, a high power, and a wide spatial resolution of several tens of $cm^2$.

These UV lamps contain excimer gases or mixtures of gases constituted by: $Ar_2^*$, $Kr_2^*$, $Xe_2^*$, $F_2^*$, $Cl_2^*$, $Br_2^*$, $I_2^*$, $ArF^*$, $ArCl^*$, $KrCl^*$, $XeCl^*$, $HgNe^*$, $HgAr^*$, $HgKr^*$, $HgXe^*$.

The document U.S. Pat. No. 5,441,569 describes a processing device for thin layer depositions making use of two lasers, one $CO_2$ and the other excimer with a wave-length of 248 nm. The lasers present small processing surfaces and the device is not equipped with infrared heating.

The document U.S. Pat. No. 5,863,327 refers to a processing apparatus using an infrared radiation source IR and an ultraviolet radiation source with lamps UV having wavelengths comprised between 50 nm and 300 nm.

OBJECT OF THE INVENTION

The object of the invention is to achieve a surface processing process consisting in lowering the processing temperature of the material so as not to adversely affect the resistance of the substrate or of the sub-layers, regardless of their natures or compositions.

The process according to the invention is characterized in that:

a second excimer type ultraviolet radiation UV, having a spectral resolution lower than 40 nm regardless of the wavelength of the ultraviolet radiation UV is used inside said reaction chamber so as to generate a photon flux suitable either for modification of the physico-chemical properties of the material M or for formation of said deposit, the exposure time of the second ultraviolet radiation UV is shorter than that of the first infrared radiation IR, the processing temperature is comprised between 70° C. and 800° C. according to the nature of the material.

The combined action of the first infrared radiation and of the second excimer ultraviolet radiation enables the processing temperature to be lowered according to the type of material and of the substrate. Materials having lower thermal resistances than that of silicon will thus be able to be used for the substrate and the sub-layers.

The spectral resolution of the second ultraviolet radiation UV is preferably about 10 nm.

According to another feature of the invention, the material or substance to be processed contains a compound which is photochemically sensitive to the wavelength of the photon flux of the second excimer ultraviolet radiation UV.

The invention also relates to a processing device comprising:

infrared emitters designed to obtain a first infrared radiation IR causing rapid heating of the substrate, ultraviolet lamps of the excimer type capable of emitting a second ultraviolet radiation UV having a spectral resolution lower than 40 nm causing a modification of the properties of the material or substance to be treated, windows, inserted between the substrate and the infrared emitters and ultraviolet lamps, and made of a transparent material letting the first infrared radiation IR and the second ultraviolet radiation UV pass, and reflectors inserted between the wall of the reaction chamber and the infrared emitters and ultraviolet lamps to obtain an optimum thermal power density on the substrate.

The substrate is arranged in the central part of the reaction chamber and is subjected to the two opposite radiations from the infrared emitters and the excimer type ultraviolet lamps.

The stainless steel reaction chamber with cooled double wall preferably comprises an external pumping system connected to a first orifice to work in a vacuum or at atmospheric pressure and injection means for injecting a flow of neutral or reactive gas to said chamber via a second orifice.

In addition to the thermal processing applications of the material, two other possible applications exist with lowering of the temperature by means of an excimer ultraviolet radiation UV:

the chemical vapour deposition CVD technique which makes gaseous species react with a surface. To achieve the reaction, the surface is heated to a certain temperature by the infrared radiation IR with formation of a layer of material arising from the reaction of the gaseous species sensitive to ultraviolet radiation UV on the surface of the substrate;

the deposition technique by breakdown of an organometallic of a material on a support, consisting in spreading a layer of an organometallic sensitive to ultraviolet radiation UV. Under the effect of the ultraviolet radiation UV, the organometallic is broken down into volatile species and a metallic or non metallic layer which remains attached to the substrate. The ultraviolet radiation UV can be completed by infrared heating of the substrate.

BRIEF DESCRIPTION OF THE DRAWINGS

Other advantages and features will become more clearly apparent from the following description of an embodiment of the invention given as a non-restrictive example only and represented in the accompanying drawings, in which.

DETAILED DESCRIPTION OF A PREFERRED EMBODIMENT

Figure 1:
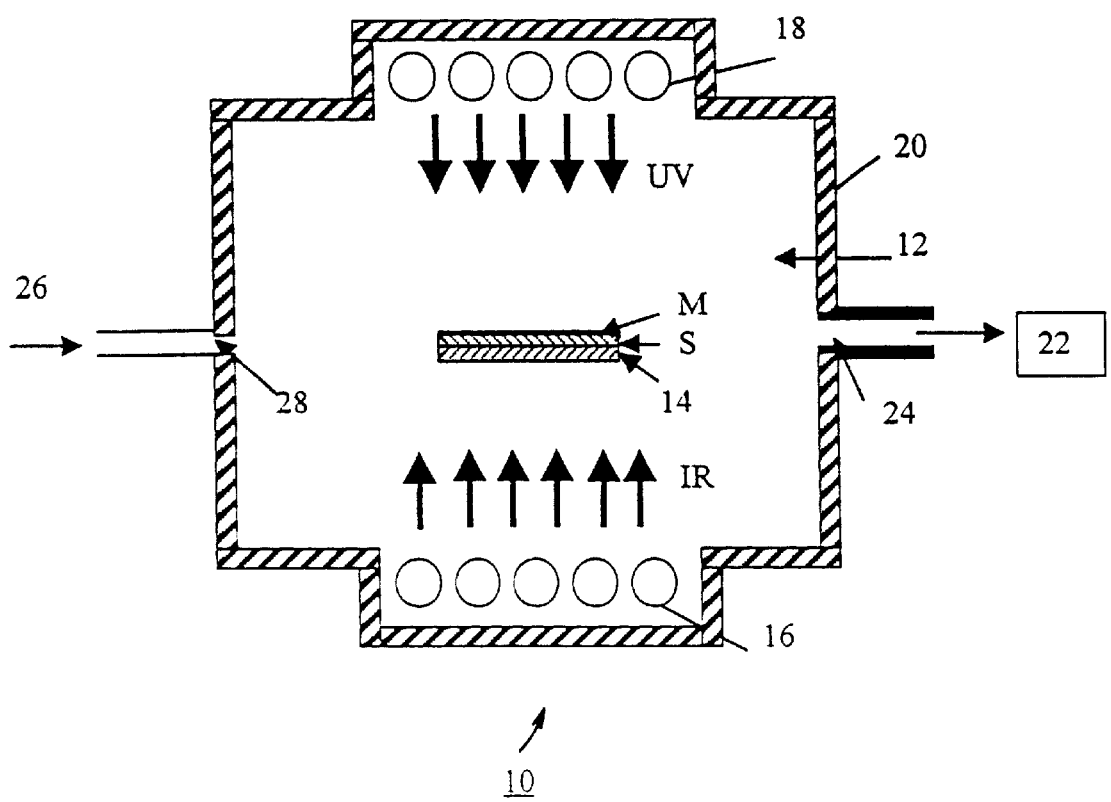
FIG. 1 is a schematic view of the processing device with combined IR and UV heating according to the invention.

In FIG. 1, the process implemented in the device 10 enables the processing temperature to be lowered due to the simultaneous contribution of two radiation sources inside the reaction chamber 12 of the furnace. The material M is generally deposited on a support formed by a substrate 14 with the possible addition of intermediate sub-layers S. The combined processing of the material M on the substrate 14 results from a first radiation IR by means of infrared emitters 16 and from a second radiation UV generated by excimer type ultraviolet lamps 18. The substrate 14 is advantageously disposed in the mid-zone of the reaction chamber 12 with the IR emitters 16 and UV lamps 18 arranged on each side thereof.

The energy flux produced by the infrared emitters 16 can reach several tens of kW enabling the substrate 14 to be heated rapidly by radiation and kept at a preset temperature for a given time.

The photon flux of the second radiation UV emitted by the excimer type ultraviolet lamps 18 arranged opposite the first infrared radiation IR acts on the exposed surface causing a modification of the properties of the material M (activation, densification, breakdown, etc.). The flux may reach 200 $mW/cm^2$.

The exposure time of the second ultraviolet radiation UV depends on the properties of the material M to be treated and on the final characteristics required. The spectral resolution of the excimer type ultraviolet radiation lamps is chosen less than 40 nm, regardless of the wavelength of the UV radiation emitted by the lamps 18.

The action of the two radiations IR and UV on the material M enables a good homogeneity of heating and of ultraviolet radiation to be obtained over the whole surface of the substrate 14. This results in thermal processing being performed at low temperature, since annealing is assisted by the second UV radiation. A wide range of materials can thus be treated in such a reaction chamber 12. The processing temperature is situated in a range from 70° C. to 800° C.

The reaction chamber 12 is made of stainless steel with a cooled double wall 20 and controlled atmosphere. An external pumping system 22 is connected to a first orifice 24 of the reaction chamber 12 to work at atmospheric pressure or to lower the internal pressure to high vacuums.

A gas flow 26 (neutral, reactive or a gas mixture) can be input by injection means to the reaction chamber 12 via a second orifice 28 to perform processings in an inert or reactive atmosphere.

In a reactive atmosphere, the exposed surface of the support, constituted by the substrate 14 coated with the sub-layers S if applicable, is in contact with gaseous species with which it can react either to form a thin layer or to modify the physico-chemical properties of the surface. The second ultraviolet radiation UV fosters this reaction.

When the material is a compound photo-chemically sensitive to the wavelength of the excimer UV photons, it can be broken down (case of organometallics) to form a thin metallic layer, or densified (case of ferroelectrics or silicon oxides) to modify its properties.

Figure 2:
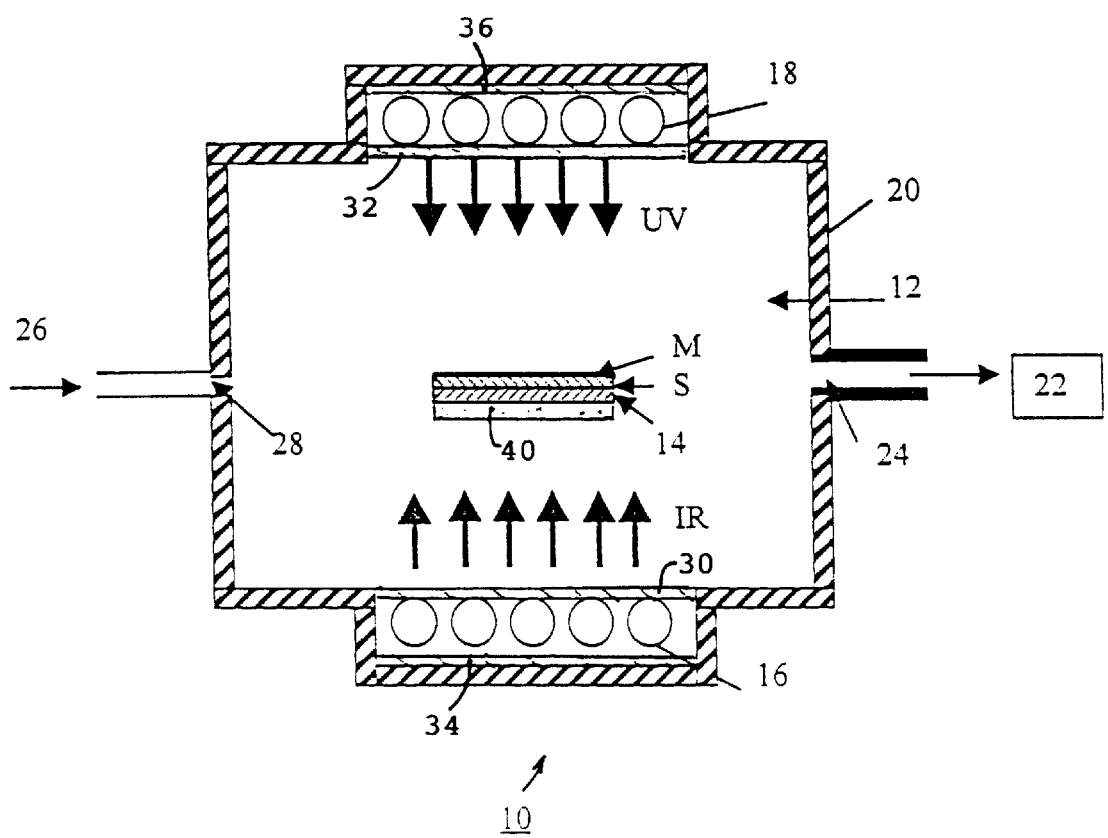
FIG. 2 is an identical view of an alternative embodiment.

With reference to FIG. 2, windows 30, 32 are arranged between the substrate 14 and the infrared emitters 16 and ultraviolet lamps 18. The windows 30, 32 separate the infrared emitters 16 and ultraviolet lamps 18 from the reaction chamber 12. These windows are made of a transparent material letting the first infrared radiation IR and the second ultraviolet radiation UV pass. Reflectors 34, 36 are arranged between the wall 20 of the reaction chamber 12 and the infrared emitters 16 and ultraviolet lamps 18 to obtain an optimum thermal power density on the substrate 14.

The window 32 of the ultraviolet lamps 18 may be substituted by an external tube arranged around each lamp. This external tube allows a pyrometric measurement through a hole of the reflector 36 so as to regulate the temperature of the substrate 14.

What is claimed is:

1. A process for processing or forming a material by electromagnetic radiation and in a controlled atmosphere or in a vacuum inside a reaction chamber, the assembly being subjected to a first infrared radiation causing rapid heating to a preset temperature so as to modify the physico-chemical properties of the material arranged on a substrate or to perform deposition of the material on said substrate, wherein a second excimer type ultraviolet radiation, having a spectral resolution lower than 40 nm regardless of the wavelength of the ultraviolet radiation is used inside said reaction chamber so as to generate a photon flux suitable either for modification of the physico-chemical properties of the material or for formation of said deposit, the exposure time of the second ultraviolet radiation is shorter than that of the first infrared radiation, the processing temperature is comprised between 70° C. and 800° C. according to the nature of the material.

2. The process for processing a material according to claim 1, wherein the spectral resolution of the second ultraviolet radiation is about 10 nm.

3. The process for processing a material according to claim 1, wherein the material contains a compound having a photochemical sensitivity to the wavelength of the photon flux of the second excimer ultraviolet radiation.

4. The process for processing a material according to claim 1, wherein formation of the deposit by the second excimer radiation is achieved by means of a reactive gas which reacts with the surface of the substrate to achieve a thin layer.

5. A processing device for processing a material by electromagnetic radiation and in a controlled atmosphere or in a vacuum inside a reaction chamber, and comprising infrared emitters designed to obtain a first infrared radiation causing rapid heating of the substrate, comprising in addition:

ultraviolet lamps of the excimer type capable of emitting a second ultraviolet radiation having a spectral resolution lower than 40 nm causing a modification of the properties of the material to be treated, windows, inserted between the substrate and the infrared emitters and ultraviolet lamps and made of a transparent material letting the first infrared radiation and the second ultraviolet radiation pass, and reflectors inserted between the wall of the reaction chamber and the infrared emitters and ultraviolet lamps to obtain an optimum thermal power density on the substrate.

6. The processing device according to claim 5, wherein the substrate is arranged in the central part of the reaction chamber and is subjected to the two opposite radiations from the infrared emitters and the excimer type ultraviolet lamps.

7. The processing device according to claim 6, wherein the reaction chamber is made of stainless steel with a cooled double wall, and comprises an external pumping system connected to a first orifice to work in a vacuum or at atmospheric pressure and means for injecting a flow of neutral or reactive gas to said chamber via a second orifice.

8. The processing device according to claim 5, wherein the substrate is located upon carbon susceptor means which absorbs said first infrared radiation IR.

\* \* \* \* \*